(12) United States Patent
Mochizuki et al.

(10) Patent No.: US 12,268,020 B2
(45) Date of Patent: Apr. 1, 2025

(54) SOURCE OR DRAIN TEMPLATE FOR REDUCING STRAIN LOSS IN SPACED-APART NANOSHEET CHANNELS

(71) Applicant: International Business Machines Corporation, Armonk, NY (US)

(72) Inventors: Shogo Mochizuki, Mechanicville, NY (US); Nicolas Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 784 days.

(21) Appl. No.: 17/484,009

(22) Filed: Sep. 24, 2021

(65) Prior Publication Data

US 2023/0100665 A1   Mar. 30, 2023

(51) Int. Cl.
*H10D 30/69*   (2025.01)
*H10D 30/01*   (2025.01)
(Continued)

(52) U.S. Cl.
CPC ........ *H10D 30/797* (2025.01); *H10D 30/031* (2025.01); *H10D 30/6757* (2025.01);
(Continued)

(58) Field of Classification Search
CPC ........ H01L 29/7848; H01L 21/823814; H01L 21/823864; H01L 27/092; H01L 29/66742; H01L 29/78696; H01L 29/42392; H01L 29/0673; H01L 29/0847; H01L 29/66439; H01L 29/161; H01L 29/165; H01L 29/6656; H01L 29/66545; H01L 29/775; H01L 29/7831; B82Y 10/00; H10D 30/797; H10D 30/031; H10D 30/6757;
(Continued)

(56) References Cited

U.S. PATENT DOCUMENTS 9,893,149 B2   2/2018   Cea et al.
9,893,167 B2   2/2018   Kim et al.
(Continued)

FOREIGN PATENT DOCUMENTS

EP   2942817 A1   11/2015

OTHER PUBLICATIONS

Li et al., "Study of silicon nitride inner spacer formation in process of gate-all-around nano-transistors." Nanomaterials 10.4 (2020): 793.

*Primary Examiner* — Allison Bernstein
(74) *Attorney, Agent, or Firm* — CANTOR COLBURN LLP; L. Jeffrey Kelly

(57) ABSTRACT

Embodiments of the invention are directed to a semiconductor-based structure that includes a stack having spaced-apart non-sacrificial nanosheets. A source or drain (S/D) trench is adjacent to the stack, wherein the S/D trench includes a bottom surface and sidewalls. A S/D template layer includes a continuous layer of a first type of semiconductor material, wherein the S/D template layer is within a portion of the S/D trench, on the bottom surface of the S/D trench, and on the sidewalls of the S/D trench. A doped S/D region is on the S/D template layer and within the S/D trench. In some aspects of the invention, the doped S/D region includes a second type of semiconductor material configured to induce strain in the spaced-apart non-sacrificial nanosheets.

25 Claims, 16 Drawing Sheets

(51) Int. Cl.
*H10D 30/67* (2025.01)
*H10D 84/01* (2025.01)
*H10D 84/03* (2025.01)
*H10D 84/85* (2025.01)

(52) U.S. Cl.
CPC ....... *H10D 84/017* (2025.01); *H10D 84/0184* (2025.01); *H10D 84/038* (2025.01); *H10D 84/85* (2025.01); *H10D 30/6735* (2025.01)

(58) Field of Classification Search
CPC ............. H10D 84/017; H10D 84/0184; H10D 84/038; H10D 84/85; H10D 30/6735; H10D 64/252; H10D 84/0188; H10D 84/903; H10D 44/474; H10D 18/221; H10D 84/135; H10D 84/144; H10D 84/201; H10H 20/826
See application file for complete search history.

(56) References Cited

U.S. PATENT DOCUMENTS

| | | |
|---|---|---|
| 9,991,261 B2 | 6/2018 | Mitard |
| 10,068,908 B2 | 9/2018 | Morin et al. |
| 10,211,307 B2 | 2/2019 | Ching et al. |
| 10,243,060 B2 | 3/2019 | Chao |
| 2020/0075718 A1 | 3/2020 | Wang et al. |
| 2020/0395446 A1* | 12/2020 | Yi .................... H01L 29/0673 |
| 2021/0098605 A1 | 4/2021 | Wang et al. |
| 2022/0406919 A1* | 12/2022 | Park ................ H01L 29/78696 |

\* cited by examiner

SOURCE OR DRAIN TEMPLATE FOR REDUCING STRAIN LOSS IN SPACED-APART NANOSHEET CHANNELS

BACKGROUND

The present invention relates in general to fabrication methods and resulting structures for semiconductor devices. More specifically, the present invention relates to fabrication methods and resulting structures for nanosheet-based transistors having a source or drain (S/D) template configured and arranged to reduce strain loss that can occur in spaced-apart or suspended nanosheet channels during transistor fabrication.

In contemporary semiconductor device fabrication processes, a large number of semiconductor devices, such as n-type field effect transistors (nFETs) and p-type field effect transistors (pFETs), are fabricated on a single wafer. Non-planar transistor device architectures, such as fin-type FETs (FinFETs) and nanosheet (or nanowire) transistors, can provide increased device density and increased performance over planar transistors. In a known FinFET architecture, the channel is formed as a high aspect-ratio fin-shaped structure. A gate runs along sidewalls and a top surface of a central portion of the fin, and the central portion of the fin functions as the FinFET channel.

In a known nanosheet transistor architecture, a gate stack is wrapped around the full perimeter of multiple "suspended" or spaced-apart nanosheet channel regions for improved control of channel current flow. The "suspended" nanosheet channel regions can be formed by forming a stack of alternating non-sacrificial nanosheets and sacrificial nanosheets between S/D regions then selectively removing the sacrificial nanosheets to form spaced-apart nanosheets that are anchored on opposite ends by the S/D regions. The non-sacrificial nanosheets will function as the transistor channel(s), and the "wrapped" gate structure is filled into the spaces that were occupied by the sacrificial nanosheets. To achieve etch selectivity between the sacrificial and non-sacrificial nanosheets, sacrificial nanosheets can be formed from SiGe, and non-sacrificial nanosheets can be formed from Si.

It is desirable to introduce strain to the channel region of an FET. For example, introducing a compressive strain (typically expressed as a percentage) into a PFET transistor tends to increase hole mobility in the channel, resulting in a faster switching response to changes in voltage applied to the transistor gate. Similarly, introducing a tensile strain into an NFET transistor tends to increase electron mobility in the channel, also resulting in a faster switching response.

SUMMARY

Embodiments of the invention are directed to a semiconductor-based structure that includes a stack having spaced-apart non-sacrificial nanosheets. A source or drain (S/D) trench is adjacent to the stack, wherein the S/D trench includes a bottom surface and sidewalls. A S/D template layer includes a continuous layer of a first type of semiconductor material, wherein the S/D template layer is within a portion of the S/D trench, on the bottom surface of the S/D trench, and on the sidewalls of the S/D trench. A doped S/D region is on the S/D template layer and within the S/D trench. In some aspects of the invention, the doped S/D region includes a second type of semiconductor material configured to induce strain in the spaced-apart non-sacrificial nanosheets.

Embodiments of the invention are directed to a semiconductor-based structure that includes a stack formed over a substrate, wherein the stack includes spaced-apart non-sacrificial nanosheets and spaced-part high-k metal gate (HKMG) structures. The stack further includes a stack sidewall that includes sidewalls of end regions of the spaced-apart non-sacrificial nanosheets and sidewalls of end regions of the spaced-apart HKMG structures. A S/D trench is adjacent to the stack, wherein the S/D trench includes a bottom surface, a first sidewall, and a second sidewall, wherein the first sidewall of the S/D trench includes the stack sidewall, and wherein the bottom surface of the S/D trench includes a portion of a top surface of the substrate. A S/D template layer includes a continuous layer of a first type of semiconductor material, wherein the S/D template layer is within a portion of the S/D trench, on the bottom surface of the S/D trench, on the first sidewall of the S/D trench, and on the second sidewall of the S/D trench. A doped S/D region is on the S/D template layer and within the S/D trench. In some aspects of the invention, the doped S/D region includes a second type of semiconductor material configured to induce strain in the spaced-apart non-sacrificial nanosheets.

Embodiments of the invention are directed to a semiconductor-based structure that includes a first semiconductor device formed in a first region of a substrate, along with a second semiconductor device formed in a second region of the substrate. The first semiconductor device includes a first stack including first spaced-apart non-sacrificial nanosheets; a first S/D trench adjacent to the first stack, wherein the first S/D trench includes a bottom surface and sidewalls; a S/D template layer including a continuous layer of a first type of semiconductor material, wherein the S/D template layer is within a portion of the first S/D trench, on the bottom surface of the first S/D trench, and on the sidewalls of the first S/D trench; and a first doped S/D region on the S/D template layer and within the first S/D trench. The second semiconductor device includes a second stack that includes second spaced-apart non-sacrificial nanosheets, spaced-apart inner spacers, and spaced-apart HKMG structures; a second S/D trench adjacent to the second stack, wherein the second S/D trench includes a bottom surface and sidewalls; wherein the bottom surface of the second S/D trench includes a portion of a top surface of the substrate; and a second doped S/D region with in the second S/D trench and on the sidewalls and bottom surface of the second S/D trench. In some embodiments of the invention, the first doped S/D region includes a second type of semiconductor material configured to induce strain in the first spaced-apart non-sacrificial nanosheets; and the second doped S/D region includes a third type of semiconductor material configured to induce strain in the second spaced-apart non-sacrificial nanosheets.

Embodiments of the invention are directed to a method of forming a semiconductor-based structure. The method includes forming a first semiconductor device in a first region of a substrate, wherein forming the first semiconductor device includes forming a first stack including first spaced-apart non-sacrificial nanosheets; forming a first S/D trench adjacent to the first stack, wherein the first S/D trench includes a bottom surface and sidewalls; forming a S/D template layer including a continuous layer of a first type of semiconductor material, wherein the S/D template layer is within a portion of the first S/D trench, on the bottom surface of the first S/D trench, and on the sidewalls of the first S/D trench; and forming a first doped S/D region on the S/D template layer and within the first S/D trench.

In the above-described embodiments, the method can further include forming a second semiconductor device in a second region of the substrate, wherein forming the second semiconductor device includes forming a second stack including second spaced-apart non-sacrificial nanosheets, spaced-apart inner spacers, and spaced-apart HKMG structures; forming a second S/D trench adjacent to the second stack, wherein the second S/D trench includes a bottom surface and sidewalls; wherein the bottom surface of the second S/D trench includes a portion of a top surface of the substrate; and forming a second doped S/D region with in the second S/D trench and on the sidewalls and bottom surface of the second S/D trench.

Embodiments of the invention are directed to a method of forming a semiconductor-based structure. The method includes forming a stack over a substrate, wherein the stack includes spaced-apart non-sacrificial nanosheets and spaced-part HKMG structures, and wherein the stack further includes a stack sidewall including sidewalls of end regions of the spaced-apart non-sacrificial nanosheets and sidewalls of end regions of the spaced-apart HKMG structures. A S/D trench is formed adjacent to the stack, wherein the S/D trench includes a bottom surface, a first sidewall, and a second sidewall. The first sidewall of the S/D trench includes the stack sidewall, and the bottom surface of the S/D trench includes a portion of a top surface of the substrate. A S/D template layer is formed and includes a continuous layer of a first type of semiconductor material, wherein the S/D template layer is within a portion of the S/D trench, on the bottom surface of the S/D trench, on the first sidewall of the S/D trench, and on the second sidewall of the S/D trench. A doped S/D region is formed on the S/D template layer and within the S/D trench. In some embodiments of the invention, the doped S/D region includes a second type of semiconductor material configured to induce strain in the spaced-apart non-sacrificial nanosheets.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-16 depict cross-sectional views of a section of a substrate/wafer after various fabrication operations to form nanosheet transistors thereon, wherein the nanosheet transistors include a source or drain (S/D) template configured and arranged to reduce strain loss that can occur in spaced-apart or suspended nanosheet channels during transistor fabrication according to embodiments of the invention, in which:

FIG. 1 depicts cross-sectional views of semiconductor-based structures after initial fabrication operations according to embodiments of the invention;

FIG. 2 depicts cross-sectional views of semiconductor-based structures after fabrication operations according to embodiments of the invention;

FIG. 3 depicts cross-sectional views of semiconductor-based structures after fabrication operations according to embodiments of the invention;

FIG. 4 depicts cross-sectional views of semiconductor-based structures after fabrication operations according to embodiments of the invention;

FIG. 5 depicts cross-sectional views of semiconductor-based structures after fabrication operations according to embodiments of the invention;

FIG. 6 depicts cross-sectional views of semiconductor-based structures after fabrication operations according to embodiments of the invention;

FIG. 7 depicts cross-sectional views of semiconductor-based structures after fabrication operations according to embodiments of the invention;

FIG. 8 depicts cross-sectional views of semiconductor-based structures after initial fabrication operations according to embodiments of the invention;

FIG. 9 depicts cross-sectional views of semiconductor-based structures after fabrication operations according to embodiments of the invention;

FIG. 10 depicts cross-sectional views of semiconductor-based structures after fabrication operations according to embodiments of the invention;

FIG. 11 depicts cross-sectional views of semiconductor-based structures after fabrication operations according to embodiments of the invention;

FIG. 12 depicts cross-sectional views of semiconductor-based structures after fabrication operations according to embodiments of the invention;

FIG. 13 depicts cross-sectional views of semiconductor-based structures after fabrication operations according to embodiments of the invention;

FIG. 14 depicts cross-sectional views of semiconductor-based structures after fabrication operations according to embodiments of the invention;

FIG. 15 depicts cross-sectional views of semiconductor-based structures after fabrication operations according to embodiments of the invention; and FIG. 16 depicts cross-sectional views of semiconductor-based structures after fabrication operations according to embodiments of the invention

DETAILED DESCRIPTION

Figure 1:
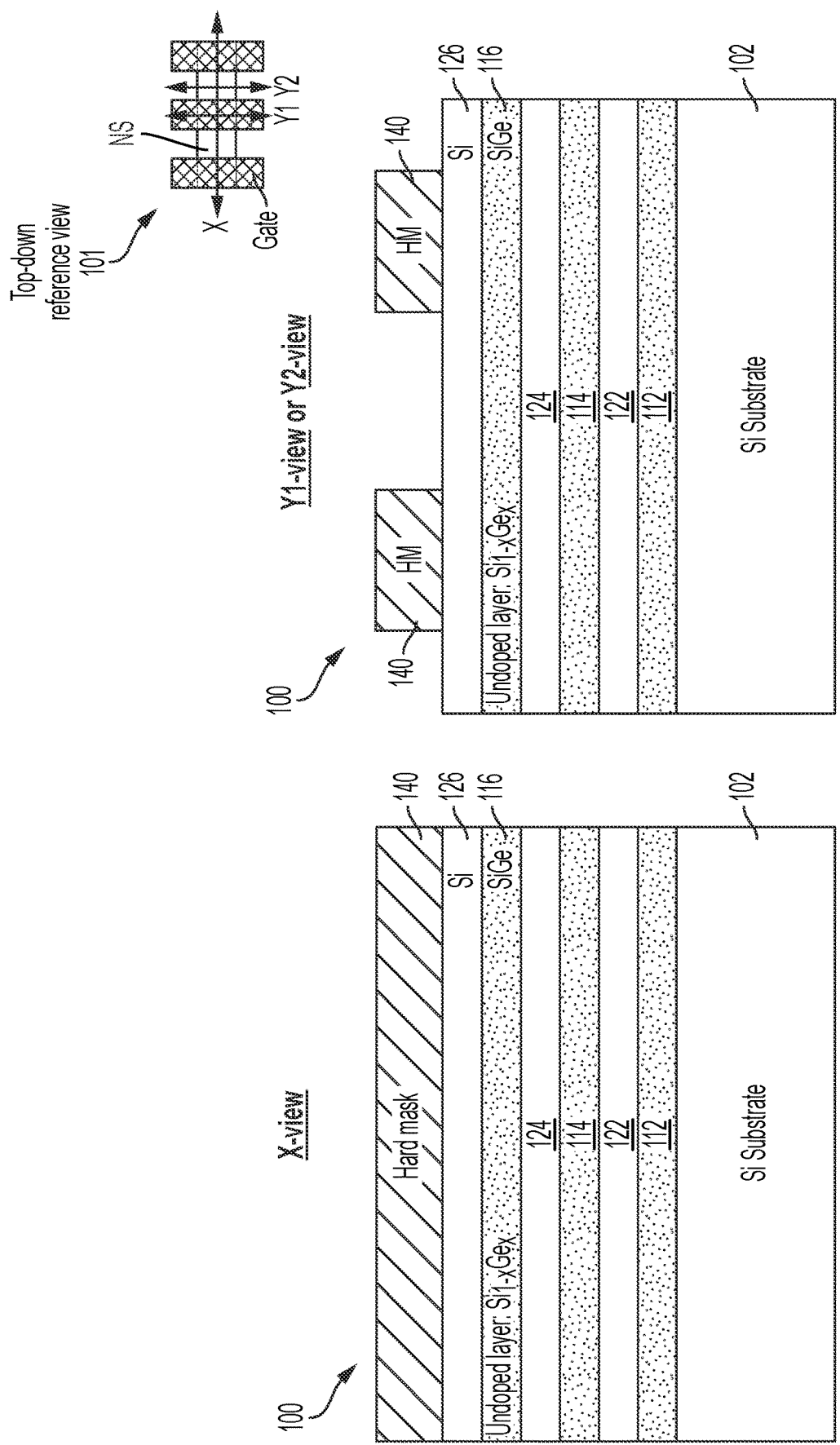

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below.

Forming FET channels from strained semiconductor material increases the mobility of charge carriers (i.e., electrons or holes) passing through channel's semiconductor lattice. Incorporating strain into the FET channel stretches the crystal lattice, thereby increasing charge carrier mobility in the channel so that the FET device becomes a more responsive switch. Introducing a compressive strain into a PFET transistor tends to increase hole mobility in the channel, resulting in a faster switching response to changes in voltage applied to the transistor gate. Similarly, introducing a tensile strain into an NFET transistor tends to increase electron mobility in the channel, also resulting in a faster switching response.

There are many ways to introduce tensile or compressive strain into transistors for both planar devices and non-planar devices. In general, such techniques typically entail incorporating into the device epitaxial layers of one or more materials having crystal lattice dimensions or geometries that differ slightly from those of the silicon substrate. Such epitaxial layers can be incorporated into source and drain regions, into the transistor gate that is used to modulate current flow in the channel, or into the channel itself, which is a portion of the fin/nanosheets. For example, epitaxially grown SiGe on source and drain regions can introduce strain into Si channel in FETs. Because the lattice constant of SiGe is larger than that of Si, compressive strain into the Si channel is induced as a result. Epitaxially grown SiGe on Si includes internal compressive strain so that hole mobility in the SiGe layer for p-type FETs is enhanced. Replacing Si atoms with Ge atoms can be accomplished during a controlled process of epitaxial crystal growth, in which a new SiGe crystal layer is grown from the surface of a bulk silicon crystal, while maintaining the same crystal structure of the underlying bulk silicon crystal.

Strain and mobility effects can be tuned by controlling the elemental composition within the epitaxially grown crystal. For example, it has been determined that epitaxial SiGe films containing a concentration of germanium in the range of 25%-40% begin to provide increased strain inducing into the Si channel compared with lower Ge concentration SiGe films. Thus, for improved device performance, it is generally advantageous to increase the percent concentration of Ge atoms in SiGe elements of an FET.

Thus, the use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si Although the use of multiple layered SiGe/Si sacrificial/non-sacrificial nanosheets (or Si/SiGe sacrificial/non-sacrificial nanosheets) can introduce some degree of strain at the interface between SiGe nanosheets and Si nanosheets, it is currently difficult to introduce enough strain in the channel regions of a nanosheet FET to have a meaningful positive impact on transistor performance characteristics such as carrier mobility, switching speed, energy consumption, and the like. Additionally, various fabrication operations (e.g., inner spacer formation and epitaxially growing the S/D regions from exposed end surfaces of the spaced-apart non-sacrificial nanosheets) trigger stain loss mechanisms such as elastic strain relaxation and plastic strain relaxation.

Turning now to an overview of aspects of the invention, embodiments of the invention provide fabrication methods and resulting structures for nano sheet-based transistors having a source or drain (S/D) template configured and arranged to reduce strain loss that can occur in spaced-apart or suspended nanosheet channels during transistor fabrication. Embodiments of the invention provide methods and resulting transistor structures for nanosheet CMOS devices with compressively strained PFET devices. In accordance with aspects of the invention, no inner spacer elements are used in the nanosheet stack, and a S/D template is used to form the S/D regions. The S/D template can be lattice matched with the S/D region to enable the S/D regions to be epitaxially grown with very low defects, which enables the S/D regions to impart strain to the channel with minimal strain loss through elastic or plastic strain relaxation.

Turning now to a more detailed description of fabrication operations according to aspects of the invention, FIGS. 1-16 depict cross-sectional views of sections 100, 1600 of a substrate/wafer 102 after various fabrication operations to form nanosheet transistors in a pFET region 510 (shown in FIG. 5) and an nFET region 520 (shown in FIG. 5) on the same substrate 102 in accordance with embodiments of the invention. Although the cross-sectional diagrams depicted in FIGS. 1-16 are two-dimensional, it is understood that the diagrams depicted in FIGS. 1-16 represent three-dimensional structures. To assist with visualizing the three-dimensional features, a top-down reference diagram 101 is shown in FIG. 1 and provides a reference point for the cross-sectional views (X-view, Y1-view, and/or Y2-view) shown in FIGS. 1-16. The X-view is a side view taken across the gates, the Y1-view is an end view taken through the active gate, and the Y2-view is an end view taken through a portion of the nanosheet (NS) stack where one of the S/D regions is (or will be) formed.

As shown in FIG. 1, after initial fabrication stages, an alternating series of SiGe sacrificial nanosheet layers 112, 114, 116 and Si non-sacrificial nanosheet layers 122, 124, 126 have been formed in a stack over a over a substrate 102, which can be formed from a variety of suitable semiconductor materials, including but not limited to Si. The substrate 102 can include a buried oxide layer (not shown separately from the substrate 102). The buried oxide layer can be made of any suitable dielectric material, such as, for example, a silicon oxide. Additionally, a patterned hard mask 140 has been deposited over the topmost Si non-sacrificial nanosheet layer 126. The hard mask 140 defines the footprint of nanosheet stacks or nanosheet fins 230 (shown in FIG. 2) that will be formed by fabrication operations depicted in FIG. 2 described subsequently herein.

In embodiments of the invention, the SiGe sacrificial layers 112, 114, 116 can utilize the notation $Si_{1-x}Ge_x$, wherein x is greater than zero (0) and less than one (1) to indicate the relative percentages of Si and Ge in the particular instance of SiGe. For example, where x=0.40, the particular instance of $Si_{1-x}Ge_x$ has 40% Ge and 60% Si. In some embodiments of the invention, the SiGe sacrificial nanosheet layers 112, 114, 116 can utilize the notation "SiGe 20%" to indicate that about 20% of the SiGe material is Ge and about 80% of the SiGe material is Si. In some embodiments of the invention, the SiGe sacrificial nanosheet layers 112, 114, 116 can be within a range from SiGe 20% to SiGe 40%.

In embodiments of the invention, the alternating nanosheet layers 112, 122, 114, 124, 116, 126 depicted in FIG. 1 can be formed by epitaxially growing one layer and then the next until the desired number and desired thicknesses of the nanosheet layers 112, 122, 114, 124, 116, 126 are achieved. Epitaxial materials can be grown from gaseous or liquid precursors. Epitaxial materials can be grown using chemical-vapor-deposition (CVD), vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
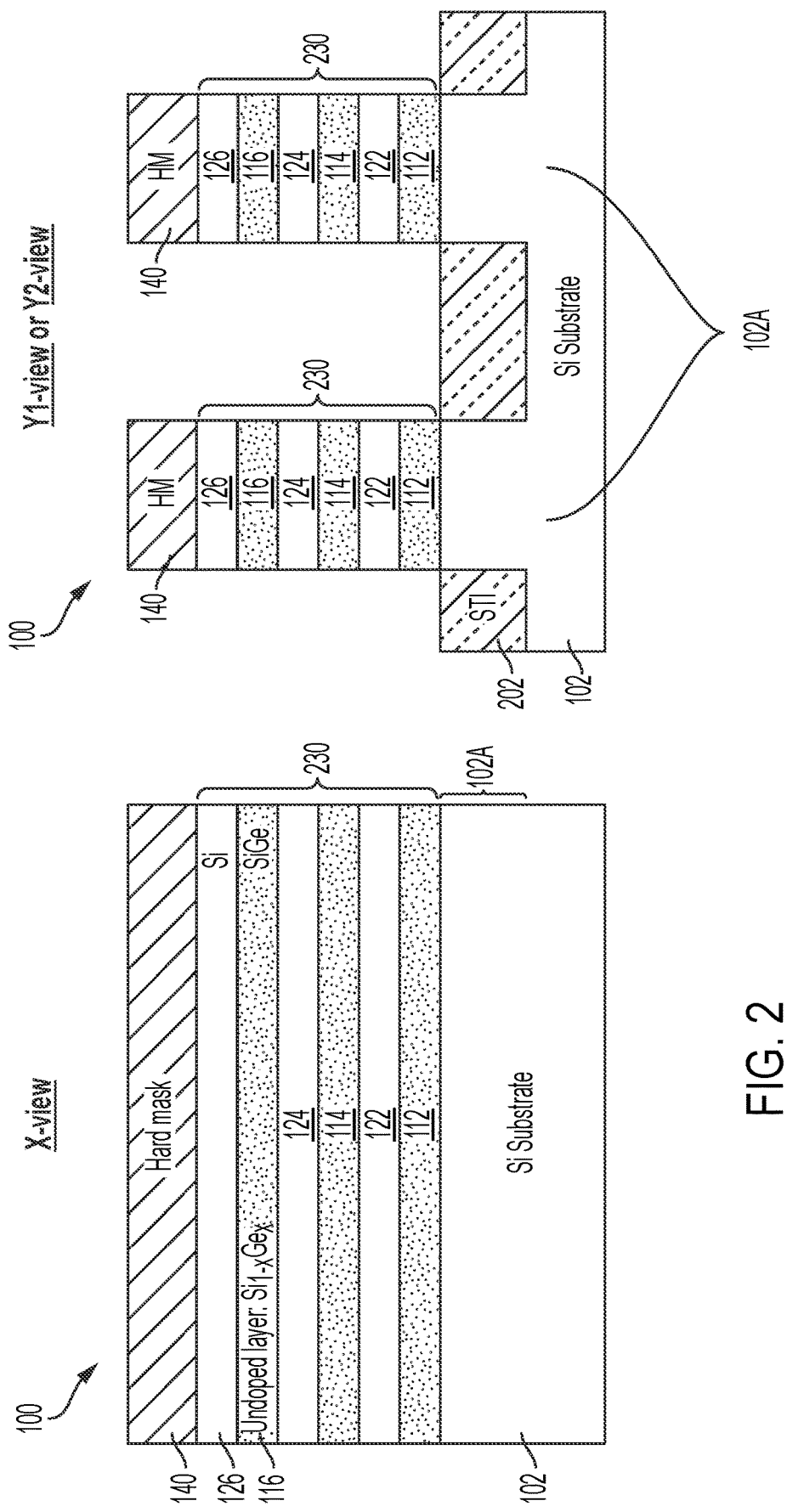

In FIG. 2, known semiconductor fabrication operations have been used to etch or recess the alternating nanosheet layers 112, 122, 114, 124, 116, 126 to form multiple intermediate stacks 230. An etch (e.g., an RIE) or a recess is applied to remove the portions of the alternating nanosheet layers that are not covered by the patterned hard mask 140, thereby forming the stacks 230. Additionally, known fabrication operations have been used to for shallow trench isolation (STI) regions 202. The STI regions 202 can be formed by depositing an oxide material (e.g., an oxide such as $SiO_2$) over the IC wafer 100 then recessing the oxide (e.g., using wet chemicals, plasma etch, or a combination of wet chemical etch and plasma etch) to form the STI regions 202.

Figure 3:
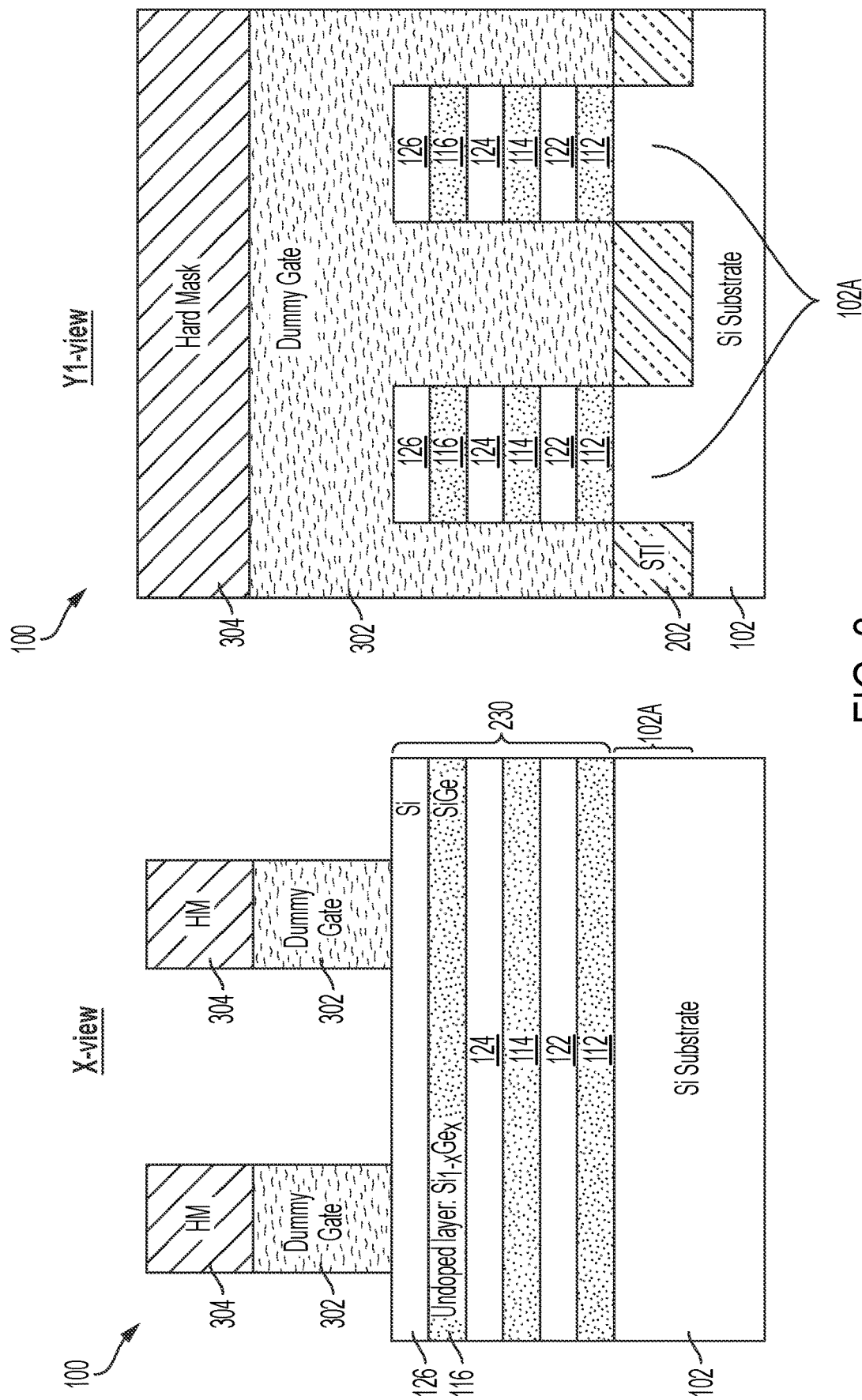

In FIG. 3, known semiconductor fabrication operations have been used to form dummy gates 302. For example, the dummy gates 302 can be formed by depositing a layer of amorphous silicon (a-Si) (not shown), depositing patterned hard masks 304 over the a-Si, and applying an etching process (e.g., an RIE) the a-Si layer to form the dummy gates 302.

Figure 4:
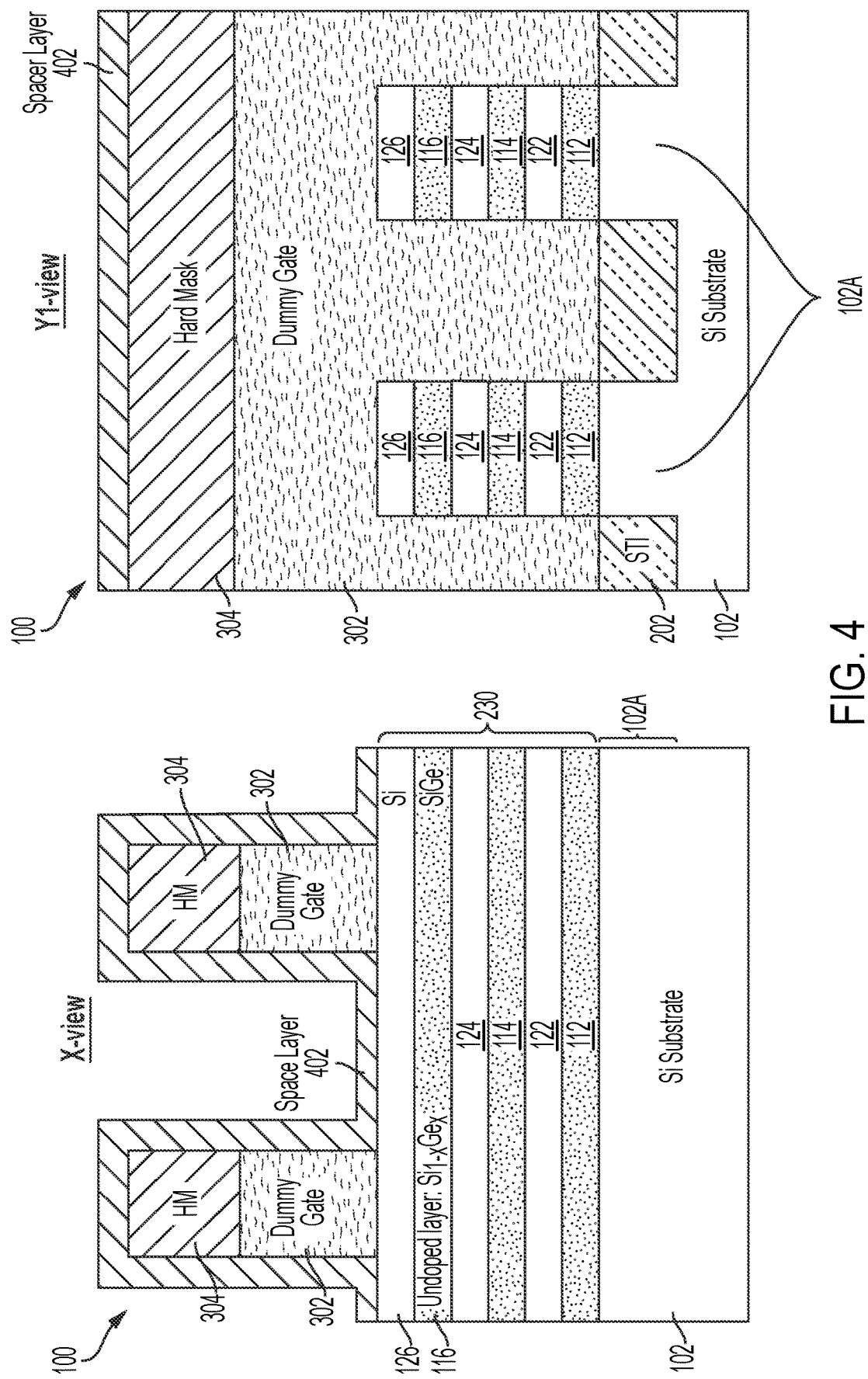

In FIG. 4, known semiconductor fabrication operations have been used to conformally deposit a spacer layer 402 (e.g., a silicon nitride material) over the structure 100.

Figure 5:
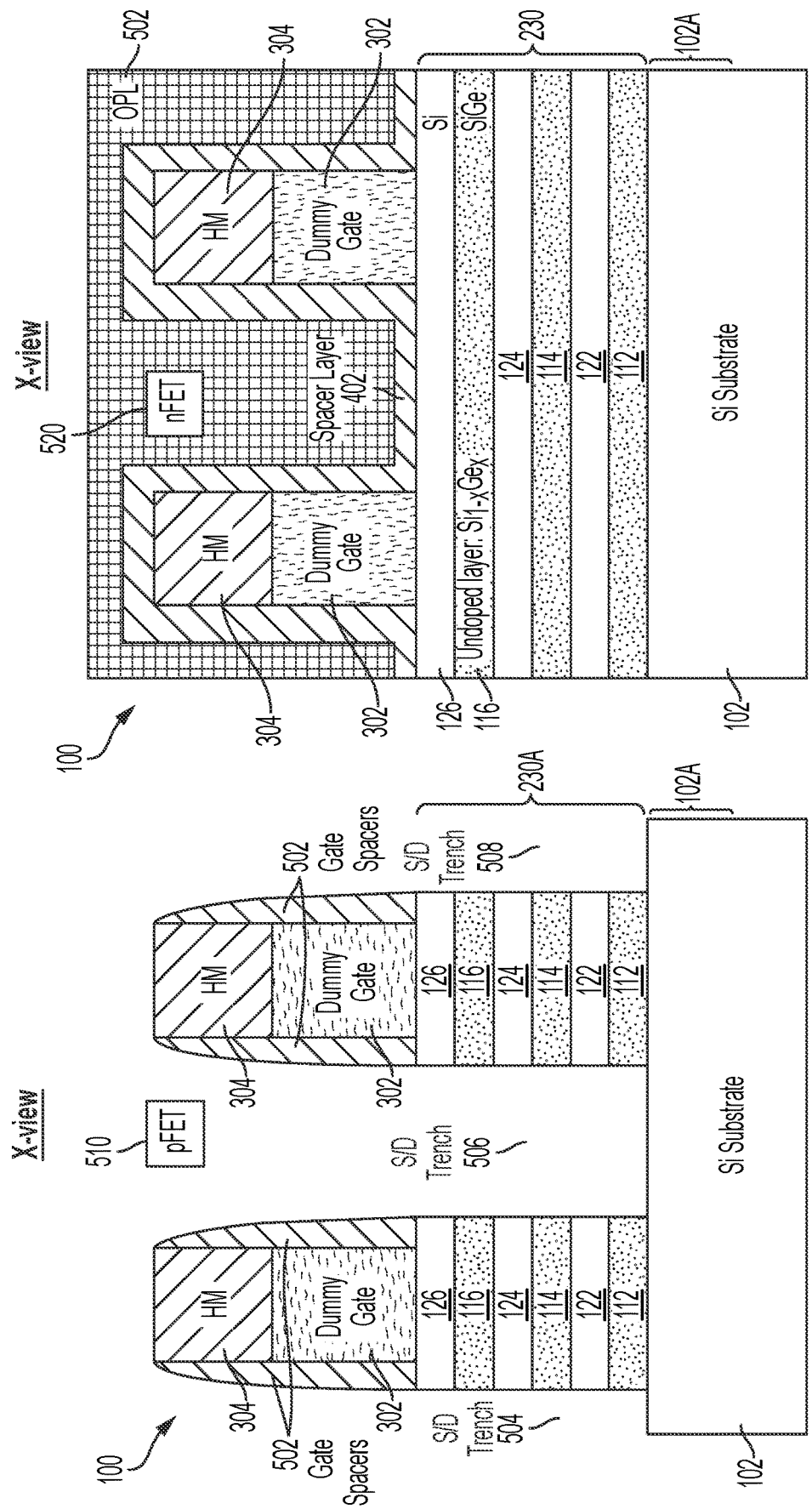

FIG. 5 depicts X-views of the structure showing a PFET region 510 of the substrate 102 and an NFET region 520 of the substrate 102. In FIG. 5, known semiconductor fabrication processes have been used to deposit a blocking mask 502 over the nFET region 520 of the substrate 102. In embodiments of the invention, the blocking mask 502 is an organic planarization layer (OPL). In general, OPLs are used as etch masks for pattern transfers into inorganic substrates, to fill pre-existing features, and to planarize the substrate to allow for larger patterning process windows.

As also shown in FIG. 5, known fabrication operations have been used to form the gate spacers 502 in the PFET region 510. The gate spacers 502 can be formed by applying a directional etch (e.g., RIE) to the gate spacer layer 402 (shown in FIG. 4) to form the gate spacers 502. In embodiments of the invention, the gate spacers 502 can also be formed using a spacer pull down formation process.

As also shown in FIG. 5, subsequent to formation of the gate spacers 502, an etch or a recess is applied to the exposed top surfaces of the stacks 230 (shown in FIG. 4) to form nanosheet stacks 230A. The rightmost and leftmost nanosheet stacks 230A can each be part of an active or inactive transistor depending on the requirements of the IC design in which the nanosheet-based structure 100 will be incorporated. Where the rightmost and/or leftmost nanosheet stack 230A is part of an active transistor, the active transistor formed from rightmost and/or leftmost nanosheet stack 230A will be in series with the transistor formed from the center nanosheet stack 230A and will share a source or drain region with the transistor formed from the center nanosheet stack 230A. Whether or not the transistors formed from the rightmost and leftmost nanosheet stacks 230A are active, the rightmost and leftmost nanosheet stacks 230A define portions of the S/D trenches 504, 506, 508 in which a S/D template layer 602 (shown in FIG. 6) and S/D regions 704, 706, 708 (shown in FIG. 7) will be formed. In accordance with aspects of the invention, the stacks 230A (with no inner spacers), the S/D template layer 602 and the S/D regions 704, 706, 708 are formed in a manner that allows the S/D regions 704, 706, 708 to be formed with low defects, which allows the S/D regions 704, 706, 708 to impart strain 710 (shown in FIG. 7) to the non-sacrificial nanosheets 122, 124, 126.

Figure 6:
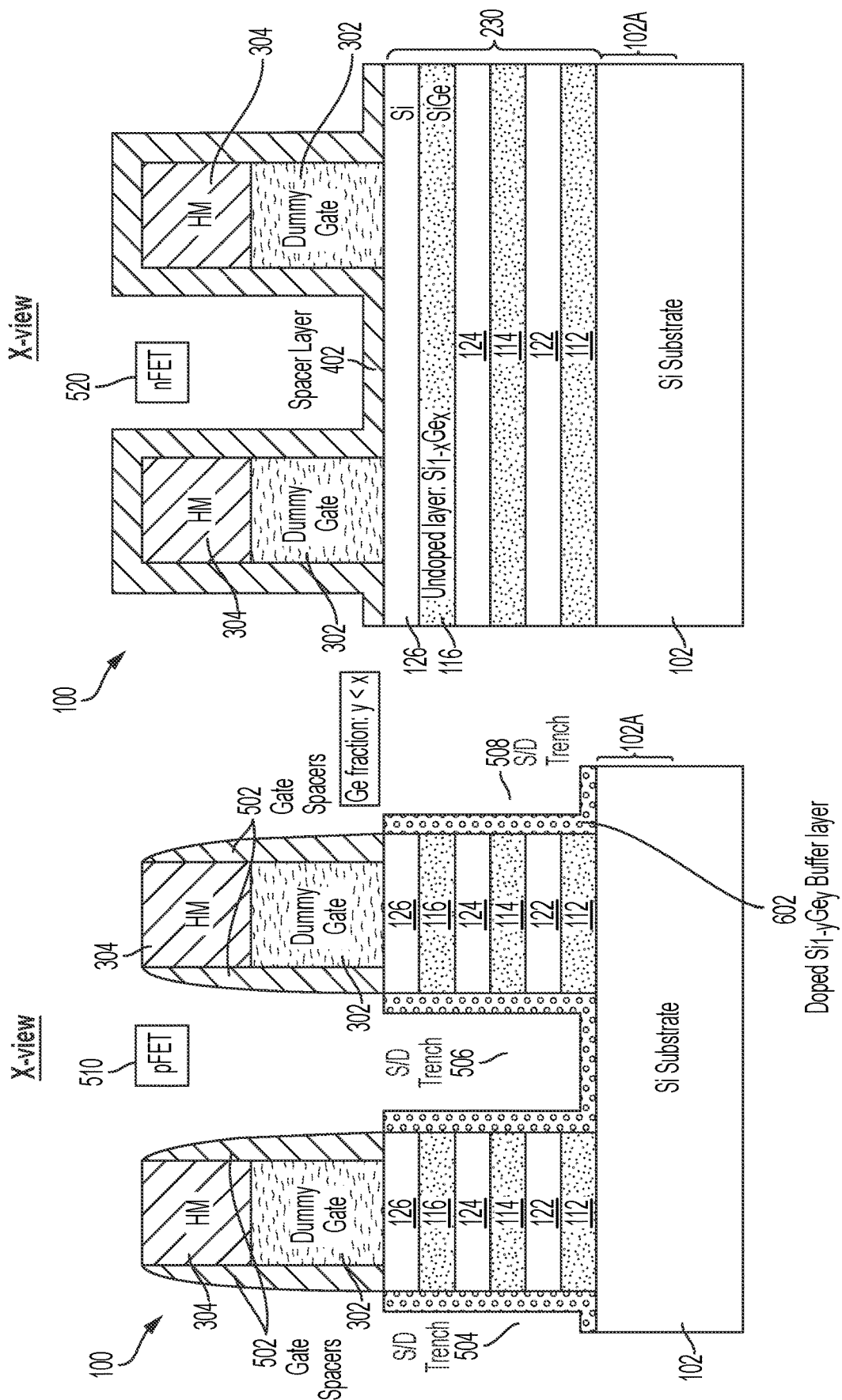

In FIG. 6, known fabrication operations have been used to selectively grow the S/D template 602 from exposed semiconductor surfaces of the structure 100, which includes the sidewalls and bottom surfaces of the S/D trenches 504, 506, 508. In accordance with aspects of the invention, the sidewalls of the S/D trenches 504, 506, 508 are defined by sidewalls of the PFET instances of the stacks 230A, and the bottom surfaces of the S/D trenches 504, 506, 508 are defined by exposed portions of the substrate 102. Because the PFET instances of the stacks 230A do not include inner spacers (e.g., inner spacers 1102 shown in FIG. 11), the sidewalls of the stacks 230A are all semiconductor materials and not interrupted by regions of dielectric inner spacer material, which allows a uniform layer of the S/D template 602 to be epitaxially grown from the S/D trench sidewalls and the S/D trench bottom surfaces. The S/D template layer 602 also provides a buffer layer between the substrate 102 and the doped S/D regions 704, 706, 708 that will be epitaxially grown from the S/D template layer 602. In accordance with embodiments of the invention, the S/D template layer 602 is formed from a material having a crystalline surface orientation that is conducive to hole mobility. In some embodiments of the invention, the previously-described material having a crystalline surface orientation that is conducive to hole mobility is $Si_{1-y}Ge_y$, where y is more than zero (0) and less than one (1). In accordance with aspects of the invention, x is greater than y to provide etch selectivity between $Si_{1-x}Ge_x$ and $Si_{1-y}Ge_y$ when the sacrificial nanosheets 112, 114, 116 are removed in subsequent fabrication operations.

Figure 7:
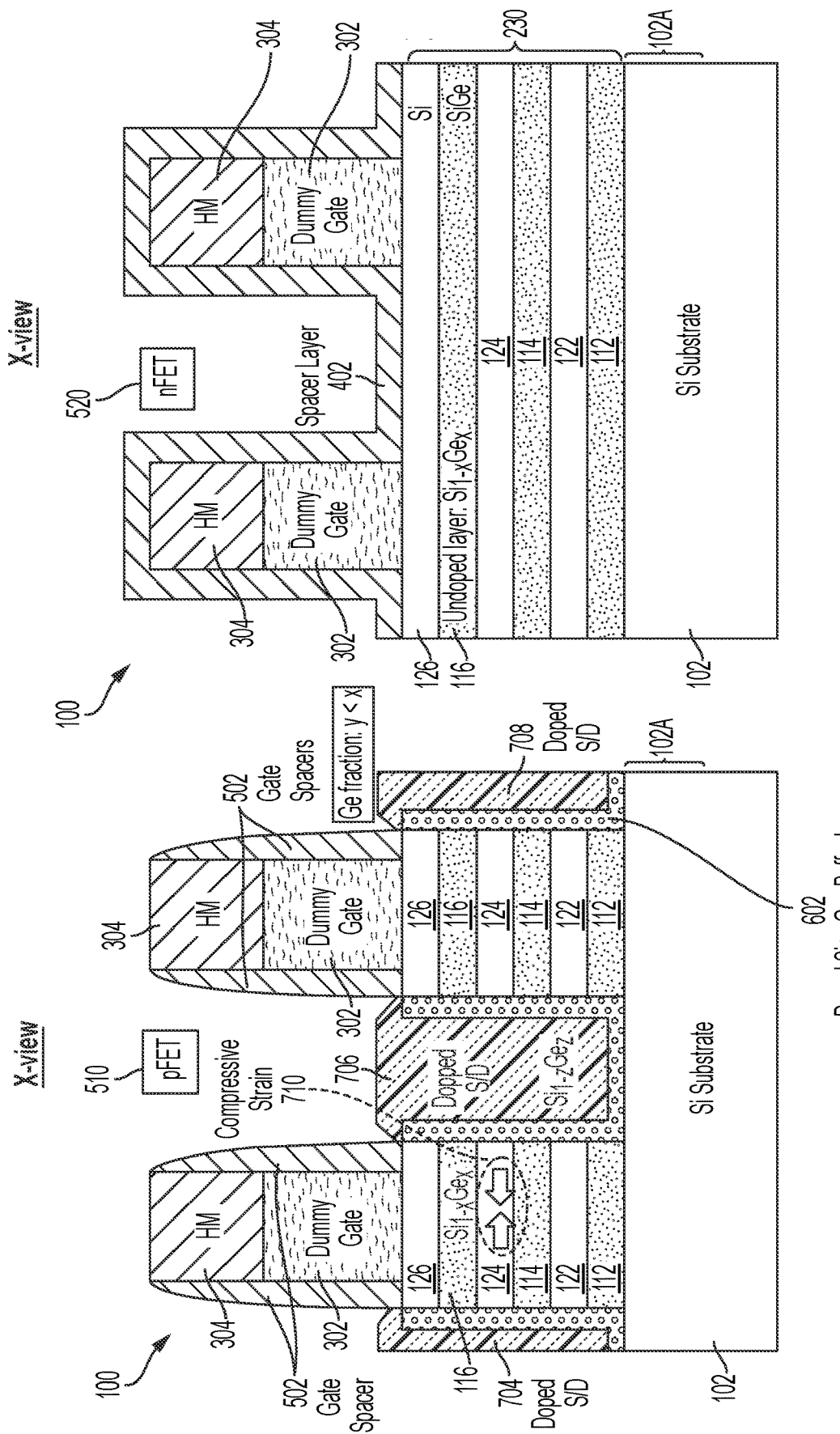

In FIG. 7, known semiconductor device fabrication processes have been used to epitaxially grow the S/D regions 704, 706, 708 from the S/D template 602 in accordance with aspects of the invention. In accordance with aspects of the invention, the S/D template layer 602 enables the S/D regions 704, 706, 708 to be epitaxially grown from the template 602 with a defect level that is below a threshold for enabling the doped S/D region 704, 705, 708 to induce the strain 710 in the spaced-apart non-sacrificial nanosheets 122, 124, 126. Additionally, strain and mobility effects in the nanosheets 122, 124, 126 and the S/D regions 704, 706, 708 can be tuned by controlling the elemental composition within the epitaxially grown crystal of the S/D regions 704, 706, 708. For example, it has been determined that epitaxial SiGe films containing a concentration of germanium in the range of 25%-50% begin to provide enhanced hole mobility in Si nanosheet channel compared with lower Ge concentration SiGe films. Thus, for improved device performance, embodiments of the invention increase the percent concentration of Ge atoms in SiGe implementations of the doped S/D regions 704, 706, 708 at or above a concentration of germanium in the range of 25%-50%.

Figure 8:
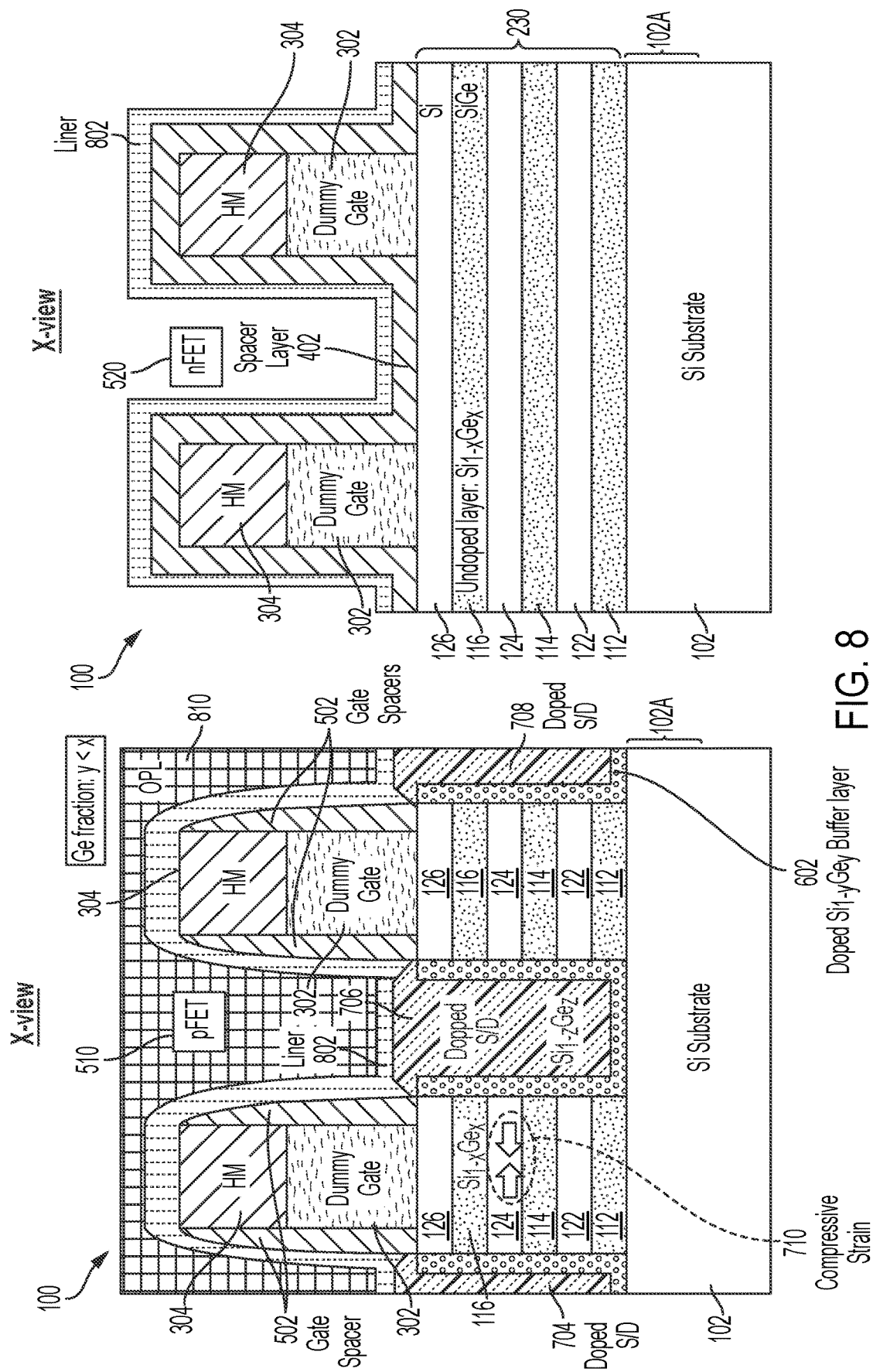

In FIG. 8, known semiconductor fabrication processes have been used to deposit a protective liner 802 over the structure 100 then deposit a blocking mask 810 over the PFET region 510 of the substrate 102. In embodiments of the invention, the blocking mask 810 is an OPL. In general, OPLs are used as etch masks for pattern transfers into inorganic substrates, to fill pre-existing features, and to planarize the substrate to allow for larger patterning process windows.

Figure 9:
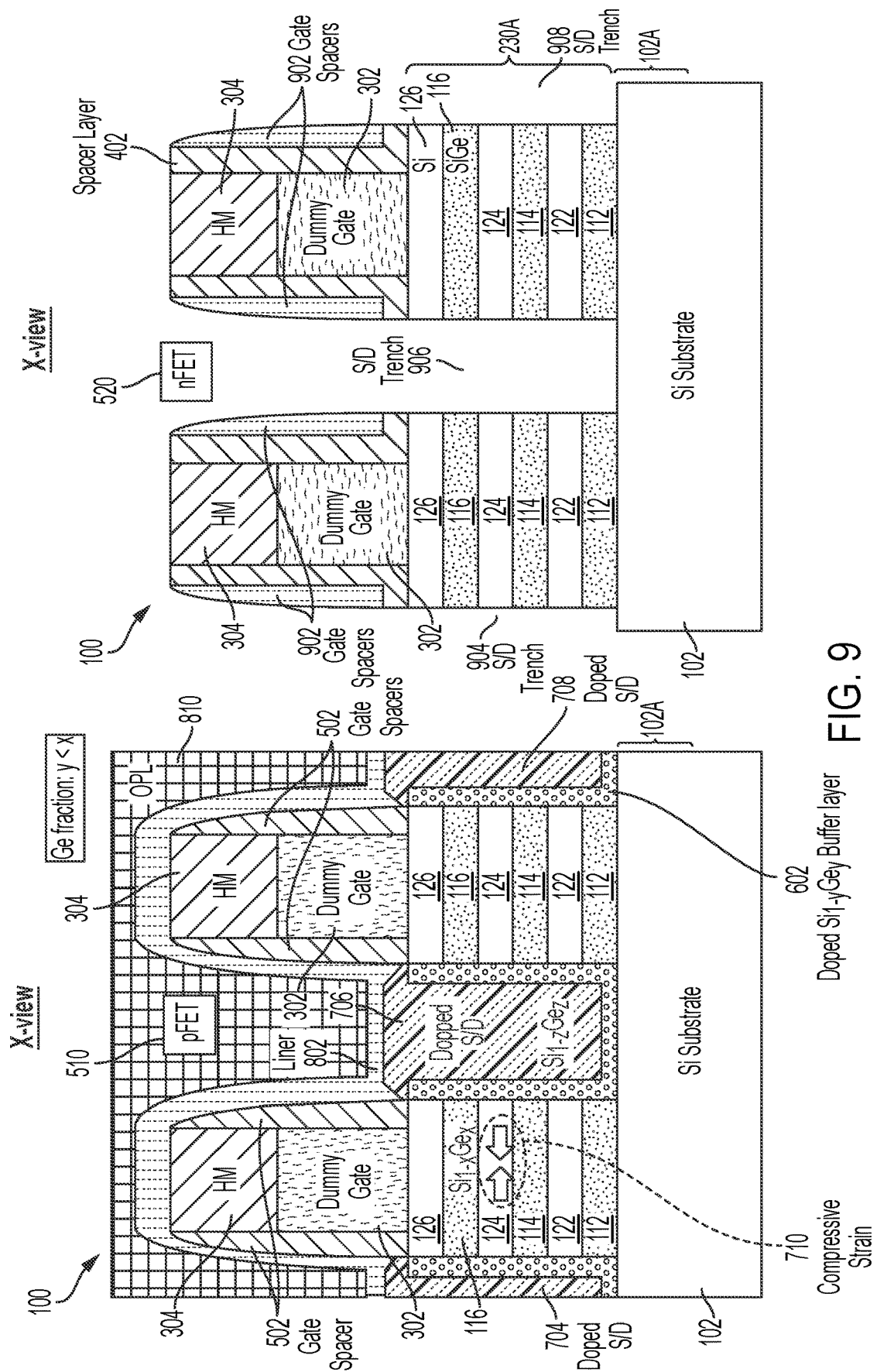

In FIG. 9, known fabrication operations have been used to form the gate spacers 902 in the NFET region 520. The gate spacers 902 can be formed by applying a directional etch (e.g., RIE) to the liner 802 and the gate spacer layer 402 (shown in FIG. 8) to form the gate spacers 902. In embodiments of the invention, the gate spacers 902 can also be formed using a spacer pull down formation process.

As also shown in FIG. 9, subsequent to formation of the gate spacers 902, an etch or a recess is applied to the exposed top surfaces of the stacks 230 (shown in FIG. 8) to form NFET instances of the nanosheet stacks 230A. The rightmost and leftmost nanosheet stacks 230A can each be part of an active or inactive transistor depending on the requirements of the IC design in which the nanosheet-based structure 100 will be incorporated. Where the rightmost and/or leftmost nanosheet stack 230A is part of an active transistor, the active transistor formed from rightmost and/or leftmost nanosheet stack 230A will be in series with the transistor formed from the center nanosheet stack 230A and will share a source or drain region with the transistor formed from the center nanosheet stack 230A. Whether or not the transistors formed from the rightmost and leftmost nanosheet stacks 230A are active, the rightmost and leftmost nanosheet stacks 230A define portions of the S/D trenches 904, 906, 908.

Figure 10:
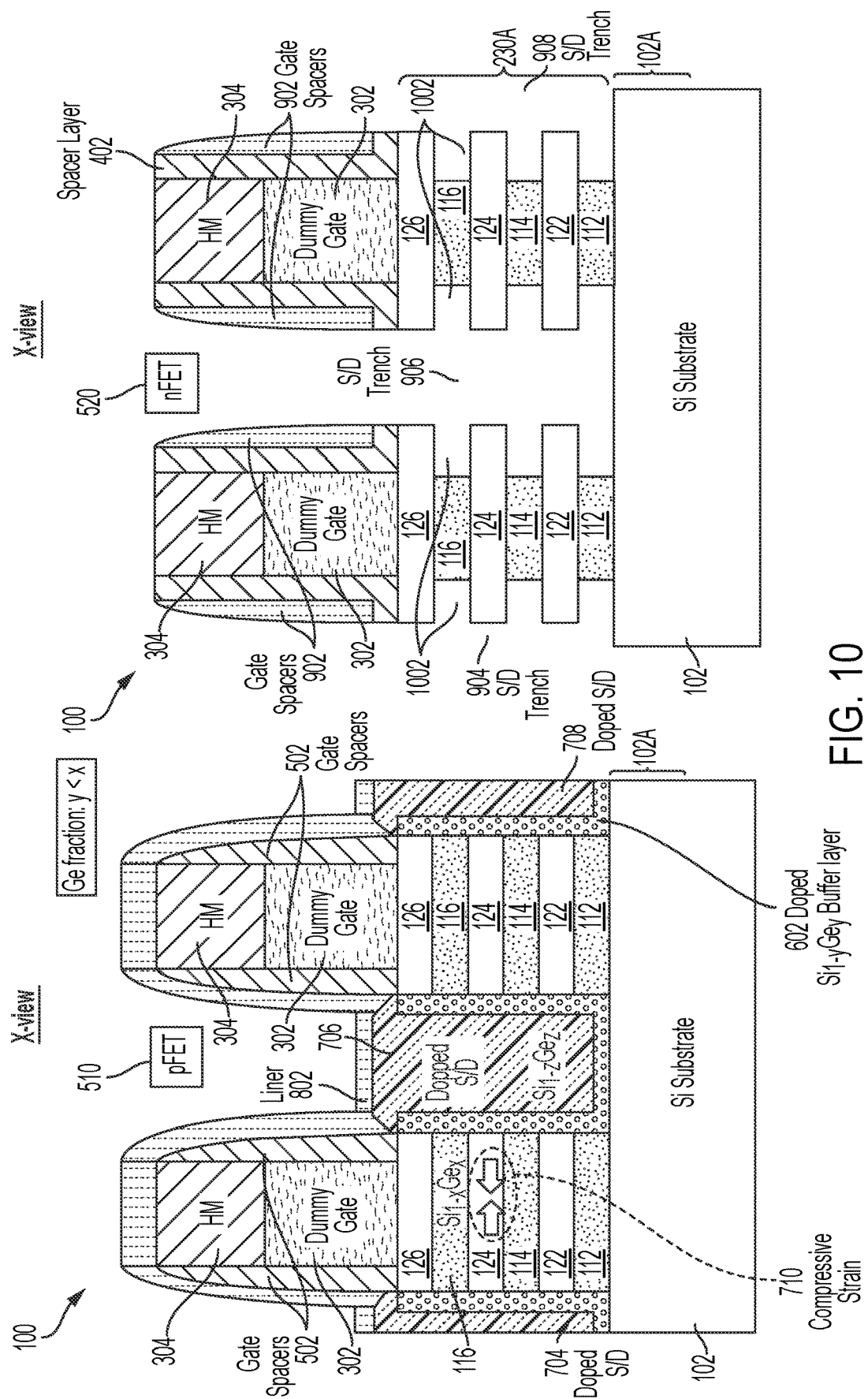

In FIG. 10, known semiconductor fabrication processes have been used to form pull back end region cavities 1002 in the SiGe sacrificial nanosheets 112, 114, 116 from underneath the liner 802 and gate spacers 902 using, for example, a hydrogen chloride (HCl) gas isotropic etch process, any other dry etch process, or any other wet etch process, which etches SiGe without attacking Si. The end region cavities 1002 are formed to thicknesses that substantially match the desired thickness of the to-be-formed inner spacers 1102 (shown in FIG. 11).

Figure 11:
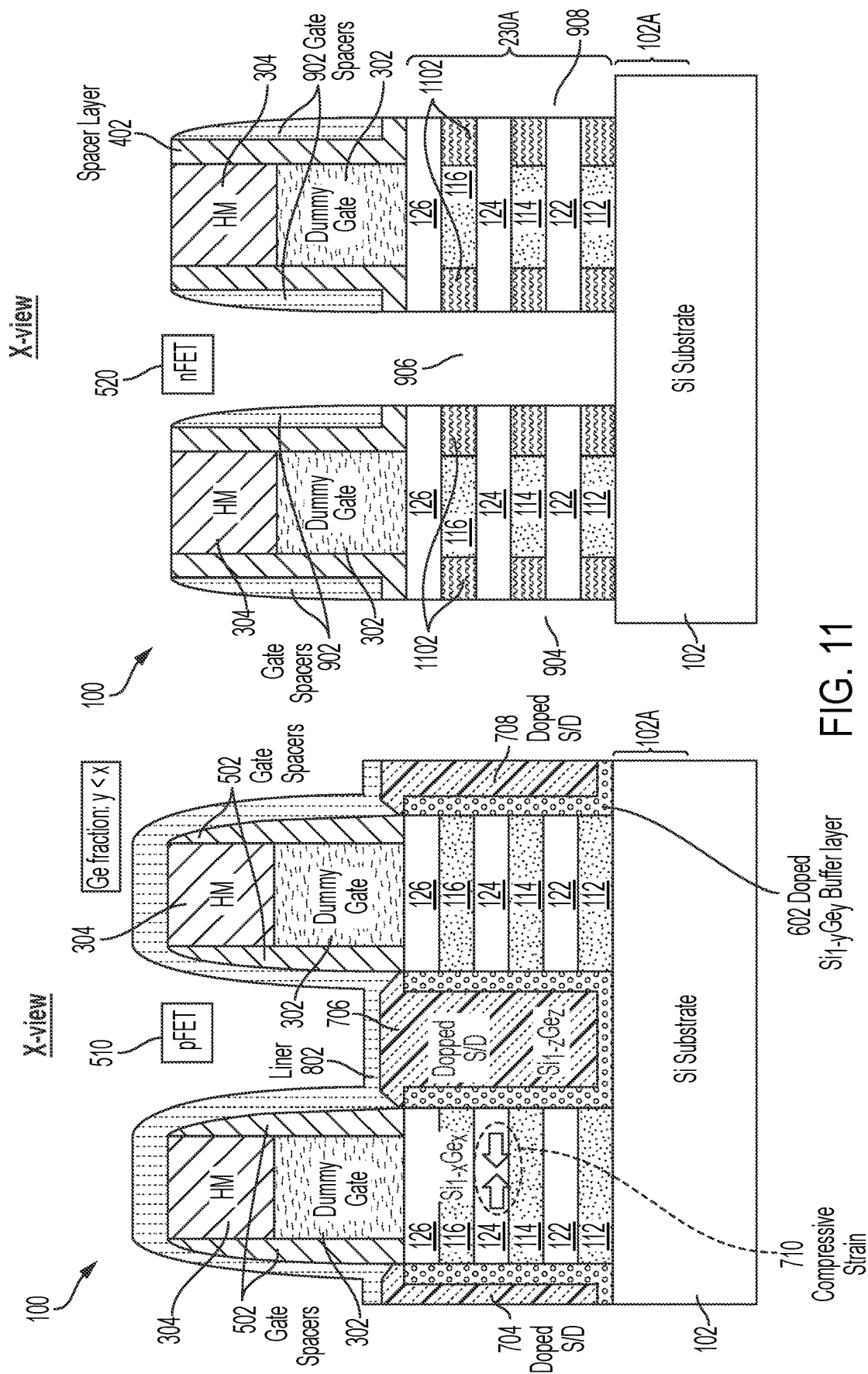

In FIG. 11, known semiconductor fabrication operations (e.g., ALD) have been used to conformally deposit a layer of inner spacer liner material (not shown) over the nanosheet-based structure 100. The inner spacer liner material can be silicon nitride, silicoboron carbonitride, silicon carbonitride, silicon carbon oxynitride, or any other type of dielectric material (e.g., a dielectric material having a dielectric constant k of less than about 5). Additionally, known semiconductor device fabrication processes have been used to form inner spacers 1102 by applying an isotropic etch back on the inner spacer layer material to remove excess dielectric material on exposed vertical and horizontal surfaces of the nanosheet-based structure 100, thus leaving the portions of the inner spacer layer material that pinched off in the inner spacer cavities 1002 (shown in FIG. 10), thereby forming the inner spacers 1102.

Figure 12:
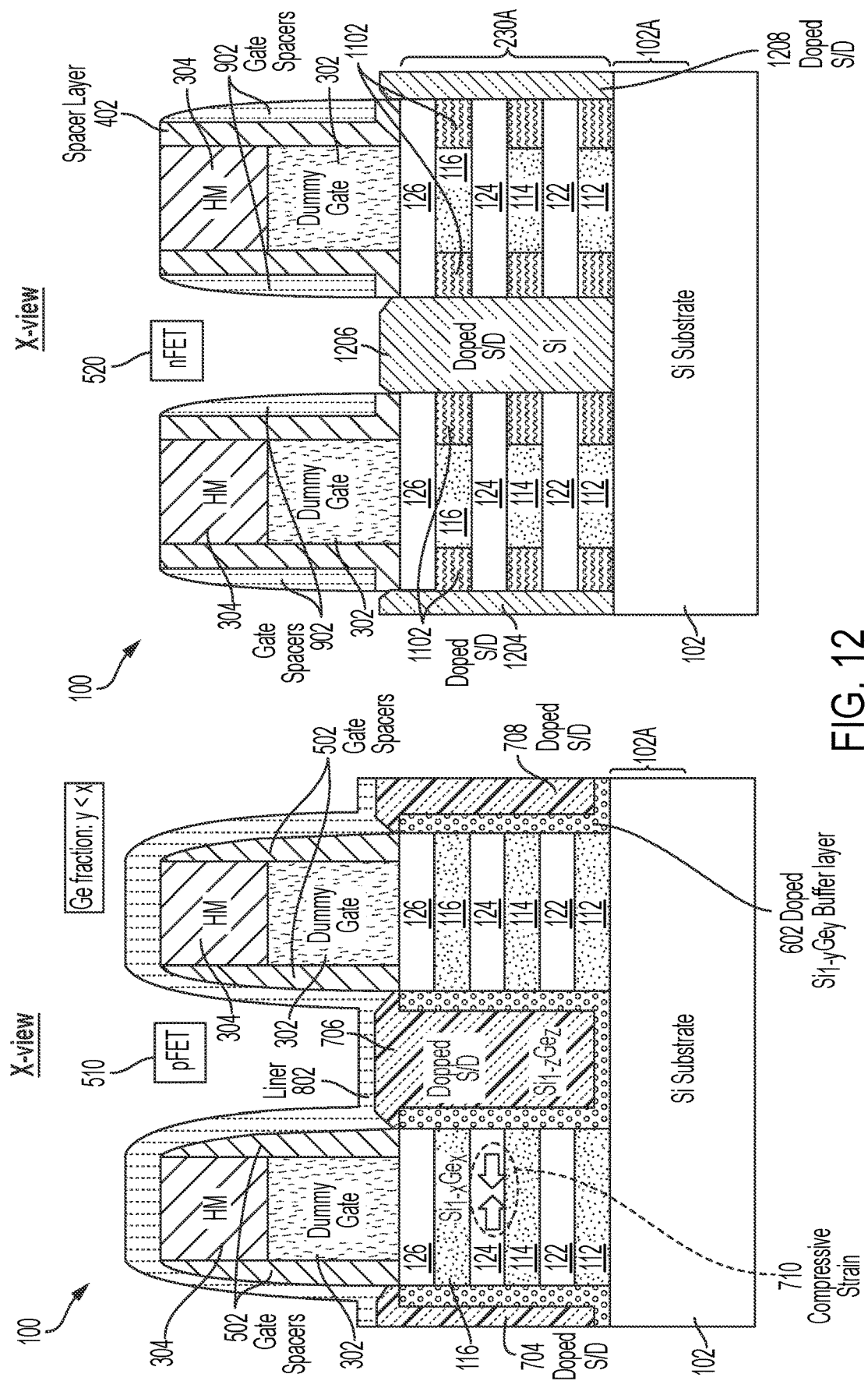

In FIG. 12, known fabrication operations have been used to form doped S/D regions 1204, 1206, 1208 in the S/D trenches 904, 906, 908 (shown in FIG. 11). In embodiments of the invention, an epitaxial growth process can be used to grow the doped S/D regions 1204, 1206, 1208 from exposed ends of the Si non-sacrificial nanosheets 122, 124, 126. In embodiments of the invention, the doped S/D regions 1204, 1206, 1208 can be epitaxially grown from gaseous or liquid precursors using, for example, chemical-vapor-deposition (CVD), vapor-phase epitaxy (VPE), molecular-beam epitaxy (MBE), liquid-phase epitaxy (LPE), or other suitable process. In embodiments of the invention, the doped S/D regions 1204, 1206, 1208 can be doped during deposition (e.g., in-situ doped) by adding dopants such as n-type dopants (e.g., phosphorus or arsenic) or p-type dopants (e.g., Ga, B, $BF_2$, or Al) during the above-described methods of forming the doped S/D regions 1204, 1206, 1208.

Figure 13:
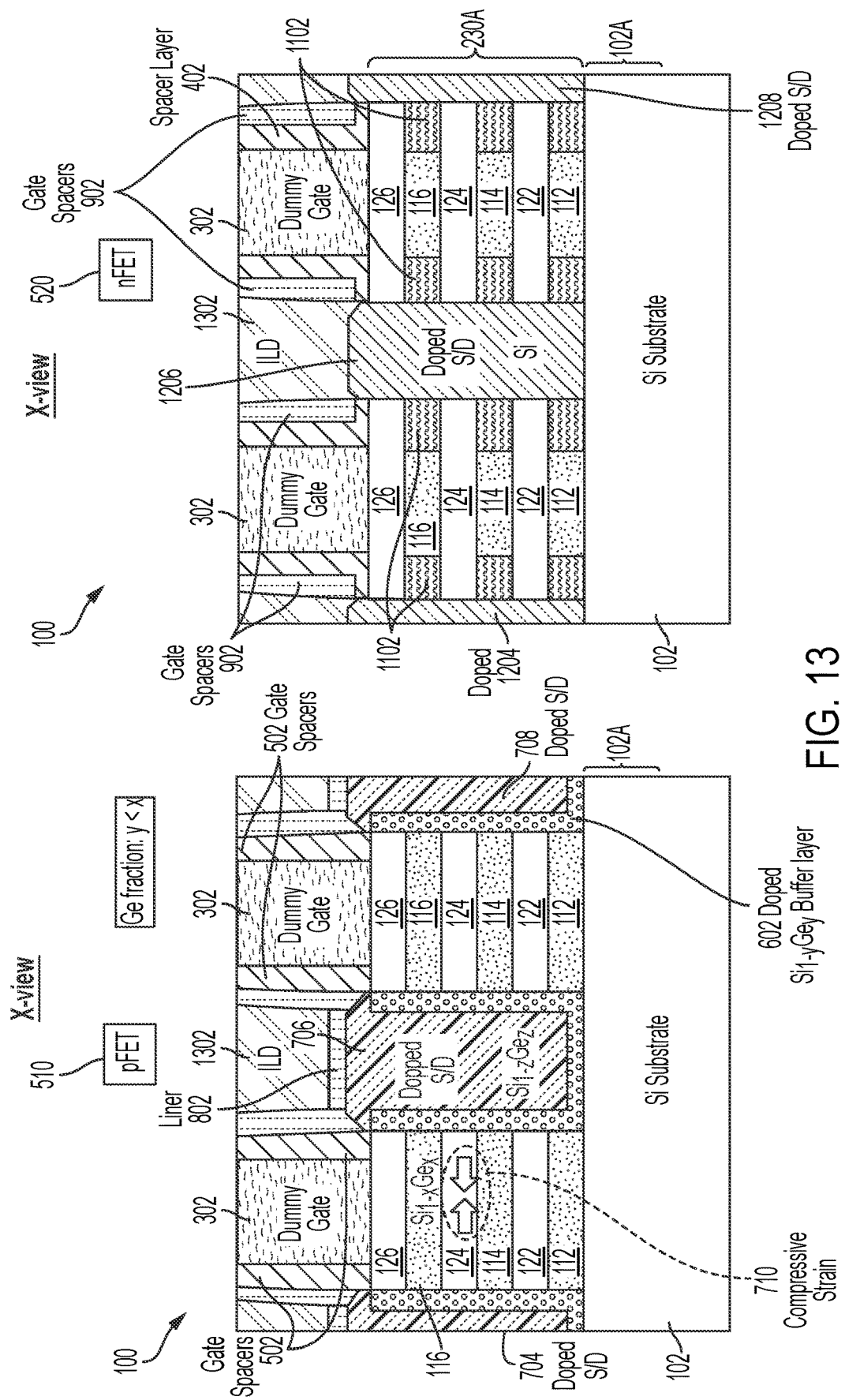

As also shown in FIG. 13, known semiconductor device fabrication processes have been used to deposit an interlayer dielectric (ILD) 1302 to fill in remaining open spaces of the nanosheet-based structure 100 and stabilize the nanosheet-based structure 100. The structure 100 is planarized to a predetermined level that removes the hard masks 304, portions of the liners 802, and portions of the gate spacers 902. In aspects of the invention, the deposited ILD regions 1302 can be formed from a low-k dielectric (e.g., k less than about 4) and/or an ultra-low-k (ULK) dielectric (e.g., k less than about 2.5).

Figure 14:
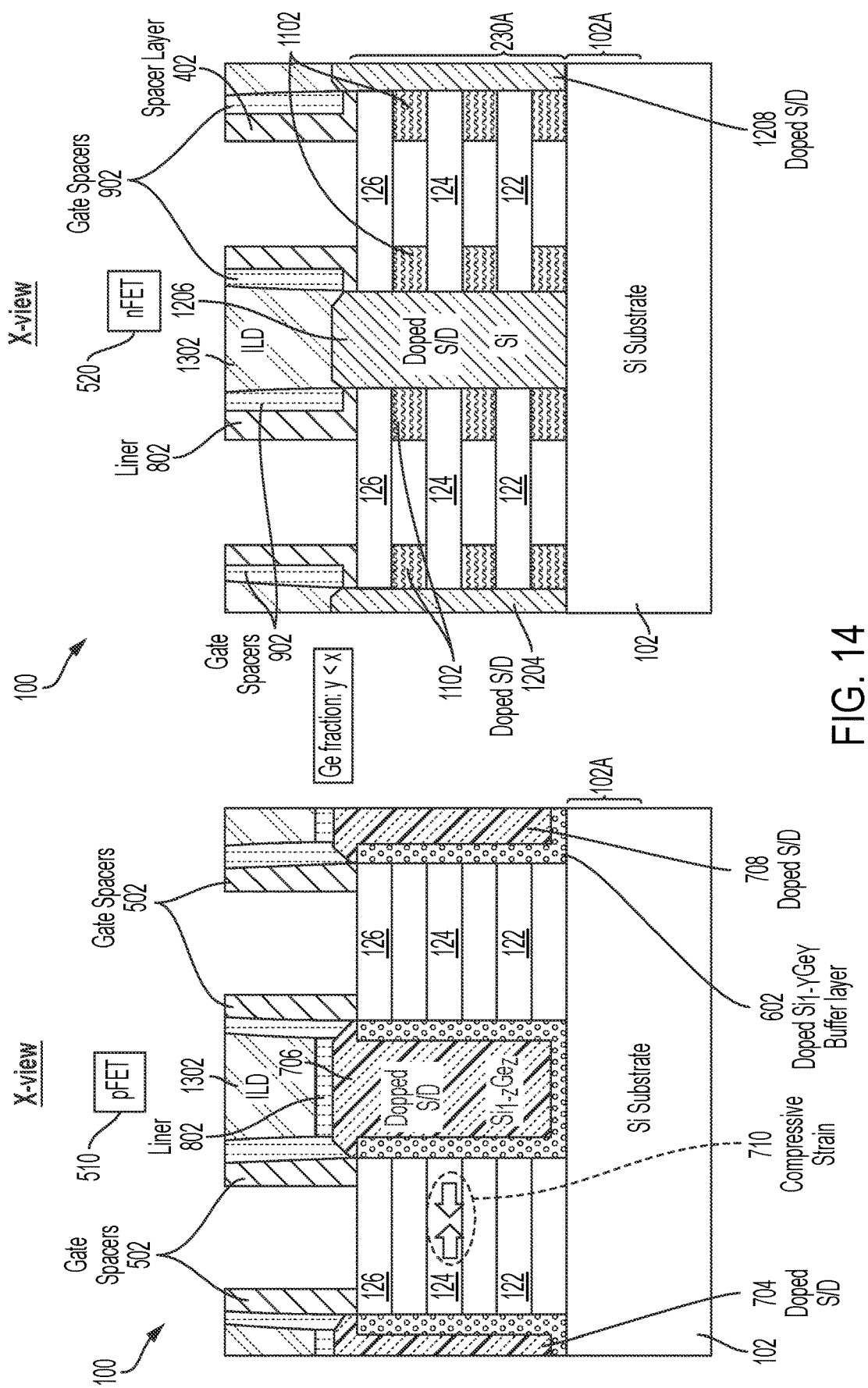

In FIG. 14, known semiconductor fabrication operations have been used to remove the sacrificial nanosheets 112, 114, 116 and the dummy gates 302. The dummy gates 302 and the associated gate dielectric (not shown) can be removed by suitable known etching processes, e.g., RIE or wet removal processes. Known semiconductor fabrication operations can be used to remove the SiGe sacrificial nanosheets 112, 114, 116 selective to S/D template layer 602 and the Si non-sacrificial nanosheets 122, 124, 126. In embodiments of the invention, because the sacrificial nanosheets 112, 114, 116 are formed from $Si_{1-x}Ge_x$, they can be selectively etched with respect to the S/D template layer 602 and the Si non-sacrificial nanosheets 122, 124, 126 using, for example, a vapor phase hydrogen chloride (HCL) gas isotropic etch process, any other dry etch process, or any other wet etch process.

Figure 15:
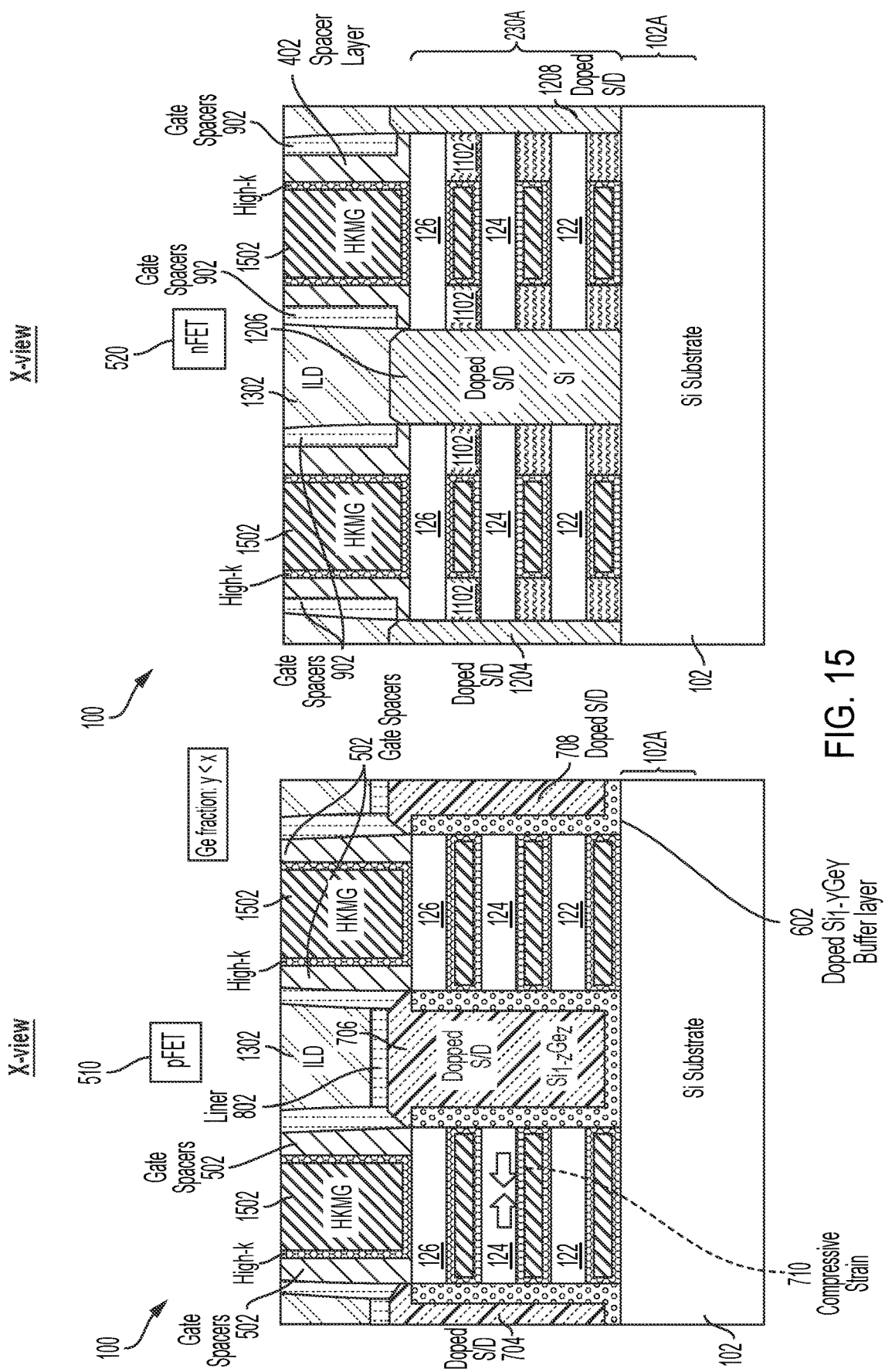

In FIG. 15, the completed nanosheet transistors are formed in the PFET region 510 and the NFET region 520 by depositing a high-k metal gate (HKMG) structure or stack 1502 in the regions that were occupied by the dummy gates 302 and the sacrificial nanosheets 112, 114, 116. The HKMG stack 1502 can be formed using any suitable known fabrication operations for depositing a metal gate and a high-k dielectric layer. The HKMG stack 1502 surrounds the non-sacrificial nanosheets 122, 124, 126 and regulate carrier flow through the non-sacrificial nanosheets 122, 124, 126. The metal gate structure can include metal liners. The gate dielectric layers of the HKMG stack 1502 can include interfacial layers (IL) and high-k dielectric layers. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

Figure 16:
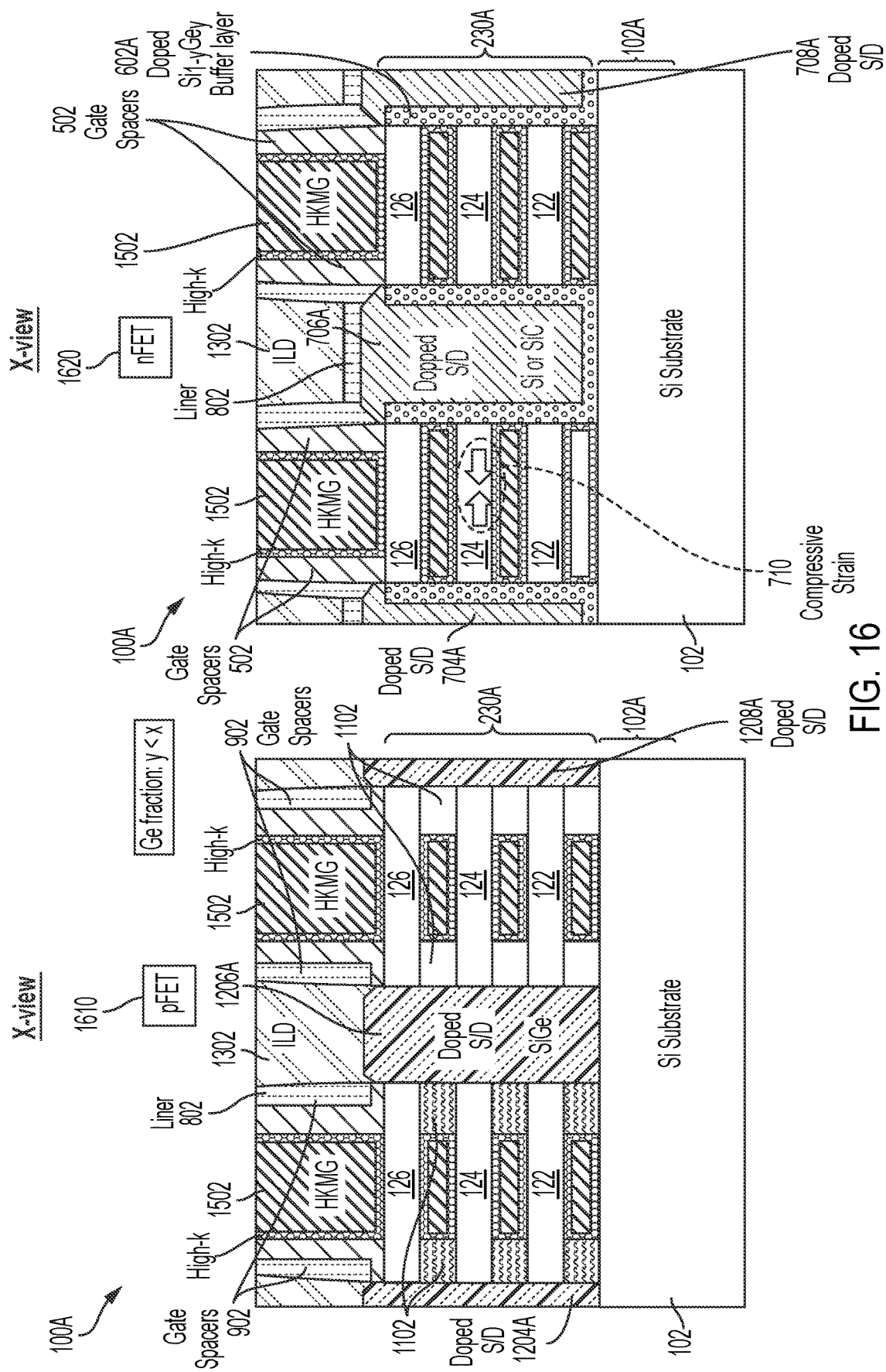

FIG. 16 depicts an embodiment of the invention in which the fabrication operations depicted in FIGS. 1-15 are modified such that the S/D template layer 602 is applied to an NFET region 1620 of a semiconductor-bases structure 100A, and the PFET region 1610 is formed in a conventional manner using gate spacers and no S/D template. In FIG. 16, the S/D template 602 provides tensile strength in the following manner. Contrary to the case of SiGe, epitaxially grown Carbon (C) and/or Phosphorus (P) doped Si on the S/D region can introduce strain into the Si channel in FETs. Because the lattice constant of Si:C, Si:P, Si:CP is smaller than that of Si, tensile strain is induced into the Si channel, which is beneficial to improve electron mobility for an NFET device. Incorporating C and P atoms can be accomplished during a controlled process of epitaxial crystal growth, in which the Si:C, Si:P, Si:CP crystal layers are grown, while maintaining the same crystal structure of the underlying single crystal material.

As with the growth of SiGe on the structure with inner spacer, epitaxially growing the S/D regions with Si:C, Si:P, Si:CP from exposed end surfaces of the spaced-apart non-sacrificial nanosheets triggers strain loss mechanisms such as elastic strain relaxation and plastic strain relaxation. In accordance with aspects of the invention, no inner spacer elements are used in the nanosheet stack, and a S/D template is used to form the S/D regions. The S/D template can be lattice matched with the S/D region to enable the S/D regions to be epitaxially grown with very low defects, which enables the S/D regions to impart strain to the channel with minimal strain loss through elastic or plastic strain relaxation.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor-based structure comprising:
a stack comprising spaced-apart non-sacrificial nanosheets;
a source or drain (S/D) region adjacent to the stack; and
a uniform thickness S/D template layer comprising a first sidewall region, a bottom region, and a second sidewall region:
wherein a lateral thickness of the first sidewall region, a vertical thickness of the bottom region, and a lateral thickness of the second sidewall region are substantially equal; and
wherein the first sidewall region is between and physically separates the spaced-apart non-sacrificial nanosheets from the S/D region.

2. The structure of claim 1 further comprising:
a gate spacer; and
a protective liner on the gate spacer and on a top surface of the S/D region;
wherein the first sidewall region is positioned substantially beneath the protective liner.

3. The structure of claim 1, wherein:
the bottom region comprises a substantially planar top surface;
the uniform thickness S/D template layer comprises a first type of semiconductor material; and
the S/D region comprises a second type of semiconductor material.

4. The structure of claim 3, wherein an elemental composition of the first type of semiconductor material is different from an elemental composition of the second type of semiconductor material.

5. The structure of claim 4, wherein:
the second type of semiconductor material comprises doped silicon germanium; and
a concentration of germanium in the doped silicon germanium is greater than about 25%.

6. The structure of claim 3, wherein the second type of semiconductor material comprises doped silicon.

7. A semiconductor-based structure comprising:
a high-k metal gate (HKMG) structure comprising an upper HKMG structure and spaced-apart HKMG structures;
a stack comprising spaced-apart non-sacrificial nanosheets and the spaced-part HKMG structures;
wherein the stack further comprises a stack sidewall comprising sidewalls of end regions of the spaced-apart non-sacrificial nanosheets and sidewalls of end regions of the spaced-apart HKMG structures;
a S/D region adjacent to the stack;
a protective liner on a gate spacer and on a top surface of the S/D region; and
a uniform thickness S/D template layer comprising a first sidewall region, a bottom region, and a second sidewall region;
wherein a lateral width dimension of the upper HKMG structure is less than a lateral width dimension of at least one of the spaced-apart HKMG structures;
wherein a lateral thickness of the first sidewall region, a vertical thickness of the bottom region, and a lateral thickness of the second sidewall region are substantially equal; and
wherein the first sidewall region is between and physically separates the spaced-apart non-sacrificial nanosheets from the S/D region.

8. The structure of claim 7, wherein:
the bottom region comprises a substantially planar top surface;
the uniform thickness S/D template layer comprises a first type of semiconductor material; and
the S/D region comprises a second type of semiconductor material.

9. The structure of claim 8, wherein an elemental composition of the first type of semiconductor material is different from an elemental composition of the second type of semiconductor material.

10. The structure of claim 8, wherein the second type of semiconductor material comprises doped silicon germanium.

11. The structure of claim 10, wherein a concentration of germanium in the doped silicon germanium is greater than about 25%.

12. The structure of claim 8, wherein the second type of semiconductor material comprises doped silicon.

13. A semiconductor-based structure comprising:
a first semiconductor device formed in a first region of a substrate; and
a second semiconductor device formed in a second region of the substrate;
wherein the first semiconductor device comprises:
a first stack comprising first spaced-apart non-sacrificial nanosheets;
a first source or drain (S/D) region adjacent to the first stack;
a uniform thickness S/D template layer comprising a first sidewall region, a bottom region, and a second sidewall region; and
a protective liner on a gate spacer and on a top surface of the first S/D region;
wherein a lateral thickness of the first sidewall region, a vertical thickness of the bottom region, and a lateral thickness of the second sidewall region are substantially equal; and
wherein the first sidewall region is between and physically separates the first spaced-apart non-sacrificial nanosheets from the first S/D region;
wherein the second semiconductor device comprises:
a second stack comprising second spaced-apart non-sacrificial nanosheets, spaced-apart inner spacers, and spaced-apart high-k metal gate (HKMG) structures; and
a second S/D region adjacent the second stack; and
wherein the second S/D region is physically attached directly to ends of the second spaced-apart non-sacrificial nanosheets.

14. The structure of claim 13, wherein:
the bottom region comprises a substantially planar top surface;
the uniform thickness S/D template layer comprises a first type of semiconductor material;
the first S/D region comprises a second type of semiconductor material; and the second S/D region comprises a third type of semiconductor material.

15. The structure of claim 14, wherein an elemental composition of the first type of semiconductor material, an elemental composition of the second type of semiconductor material, and an elemental composition of the third type of semiconductor material are not the same.

16. The structure of claim 14, wherein:
the second type of semiconductor material comprises doped silicon germanium; and
the third type of semiconductor material comprises doped silicon.

17. The structure of claim 16, wherein a concentration of germanium in the doped silicon germanium is greater than about 25%.

18. The structure of claim 14, wherein:
the second type of semiconductor material comprises doped silicon; and
the third type of semiconductor material comprises doped silicon germanium.

19. A method of forming a semiconductor-based structure, the method comprising forming a first semiconductor device in a first region of a substrate, wherein forming the first semiconductor device comprises:
forming a first stack comprising first spaced-apart non-sacrificial nanosheets;
forming a first source or drain (S/D) region adjacent to the first stack;
forming a protective liner on a gate spacer and on a top surface of the first S/D region; and
forming a uniform thickness S/D template layer comprising a first sidewall region, a bottom region, and a second sidewall region;
wherein a lateral thickness of the first sidewall region, a vertical thickness of the bottom region, and a lateral thickness of the second sidewall region are substantially equal; and
wherein the first sidewall region is between and physically separates the spaced-apart non-sacrificial nanosheets from the first S/D region.

20. The method of claim 19 further comprising forming a second semiconductor device in a second region of the substrate, wherein forming the second semiconductor device comprises:
forming a second stack comprising second spaced-apart non-sacrificial nanosheets, spaced-apart inner spacers, and spaced-apart high-k metal gate (HKMG) structures; and
forming a second S/D region adjacent to the stack;
wherein the second S/D region is physically attached directly to ends of the second spaced-apart non-sacrificial nanosheets.

21. The method of claim 20, wherein:
the bottom region comprises a substantially planar top surface;
the uniform thickness S/D template layer comprises a first type of semiconductor material;
the first S/D region comprises a second type of semiconductor materials; and
the second S/D region comprises a third type of semiconductor material.

22. The method of claim 21, wherein an elemental composition of the first type of semiconductor material, an elemental composition of the second type of semiconductor material, and an elemental composition of the third type of semiconductor material are not the same.

23. A method of forming a semiconductor-based structure, the method comprising:
forming a stack over a substrate;
wherein the stack comprises spaced-apart non-sacrificial nanosheets and spaced-part high-k metal gate (HKMG) structures;
wherein the stack further comprises a stack sidewall comprising sidewalls of end regions of the spaced-apart non-sacrificial nanosheets and sidewalls of end regions of the spaced-apart HKMG structures;
forming a source or drain (S/D) region adjacent to the stack;
forming a protective liner on a gate spacer and on a top surface of the S/D region; and
forming a uniform thickness S/D template layer comprising a first sidewall region, a bottom region, and a second sidewall region;
wherein a lateral thickness of the first sidewall region, a vertical thickness of the bottom region, and a lateral thickness of the second sidewall region are substantially equal; and
wherein the first sidewall region is between and physically separates the spaced-apart non-sacrificial nanosheets from the S/D region.

24. The method of claim 23, wherein:
the bottom region comprises a substantially planar top surface;
the uniform thickness S/D template layer comprises a first type of semiconductor material; and
the S/D region comprises a second type of semiconductor material.

25. The method of claim 24, wherein an elemental composition of the first type of semiconductor material is different from an elemental composition of the second type of semiconductor material.

* * * * *